(12) United States Patent
Ye

(10) Patent No.: US 12,178,105 B2
(45) Date of Patent: Dec. 24, 2024

(54) DISPLAY PANEL AND DISPLAY DEVICE

(71) Applicants: Wuhan China Star Optoelectronics Technology Co., Ltd., Wuhan (CN); Wuhan China Star Optoelectronics Semiconductor Display Technology Co., Ltd., Wuhan (CN)

(72) Inventor: Jian Ye, Wuhan (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/602,786

(22) PCT Filed: Aug. 9, 2021

(86) PCT No.: PCT/CN2021/111627
§ 371 (c)(1),
(2) Date: Oct. 11, 2021

(87) PCT Pub. No.: WO2023/000404
PCT Pub. Date: Jan. 26, 2023

(65) Prior Publication Data
US 2024/0122024 A1     Apr. 11, 2024

(30) Foreign Application Priority Data

Jul. 19, 2021   (CN) ......................... 202110812930.7

(51) Int. Cl.
*G06F 3/041*      (2006.01)
*H10K 59/131*    (2023.01)
(Continued)

(52) U.S. Cl.
CPC ........... *H10K 59/40* (2023.02); *G06F 3/0412* (2013.01); *H10K 59/1315* (2023.02); *H10K 59/873* (2023.02)

(58) Field of Classification Search
None
See application file for complete search history.

(56) References Cited

U.S. PATENT DOCUMENTS

2020/0272011 A1    8/2020   Yoshida
2021/0055816 A1*  2/2021   An .................... G06F 3/04164

FOREIGN PATENT DOCUMENTS

CN    111722761 A    9/2020
CN    111722762 A    9/2020
(Continued)

OTHER PUBLICATIONS

International Search Report in International application No. PCT/CN2021/111627, mailed on Mar. 29, 2022.
(Continued)

*Primary Examiner* — Brian M Butcher
(74) *Attorney, Agent, or Firm* — Nathan & Associates; Menachem Nathan

(57) ABSTRACT

The present disclosure provides a display panel and a display device; the display panel realizes the connection between the connecting wire and the touch metal by allowing the connecting wire to be connected to the bonding line through a via hole, and makes a length of a part in which a projection of the connecting wire on the substrate overlaps with a projection of the bonding line on the substrate less than a length of the bonding line, so that the length of the overlapped portion of the connecting wire and the touch metal layer is reduced, thereby reducing parasitic capacitance and voltage drop, and alleviating the problem of large voltage drop of the touch layer.

18 Claims, 15 Drawing Sheets

(51) Int. Cl.
*H10K 59/40* (2023.01)
*H10K 59/80* (2023.01)

(56) References Cited

FOREIGN PATENT DOCUMENTS

| CN | 111900192 A | 11/2020 |
| CN | 212515770 U | 2/2021 |
| CN | 112799544 A | 5/2021 |
| CN | 113064510 A | 7/2021 |

OTHER PUBLICATIONS

Written Opinion of the International Search Authority in International application No. PCT/CN2021/111627, mailed on Mar. 29, 2022.

* cited by examiner

DISPLAY PANEL AND DISPLAY DEVICE

FIELD OF INVENTION

The present disclosure relates to display technology field, specifically to a display panel and a display device.

BACKGROUND OF INVENTION

Organic light-emitting diode (OLED) display devices are widely used due to their advantages of wide viewing angles, wide color gamut, high brightness, fast response speed, low power consumption, bendable, and the like. In order to avoid the problems of small signal amount, large voltage drop of touch electrodes, and poor touch sensitivity existing in mutual capacitance, a display panel with a self-capacitance structure is used in the OLED display device. The display panel with the self-capacitance structure includes a touch layer designed in a single-layer and a touch layer designed in multiple layers. The single-layer designed touch layer means that the touch electrodes and the connecting lines are arranged on a same layer, but since the connecting lines may occupy a certain area of the touch effective area, which results in a touch blind zone, the OLED display device may adopt the multi-layered touch layer. However, in the multi-layered touch layer, since the connecting lines and the touch electrodes are arranged on different layers, and the connecting lines and the touch electrodes are arranged around the pixels, they may result in a large overlapping area between the connecting lines and the touch electrodes, and a large parasitic capacitance of the display panel, thereby resulting in a large voltage drop of the touch layer and affecting touch performance.

Therefore, the existing OLED display device has a technical problem that the overlapping area between the connection line and the touch electrode is large, thereby resulting in a large voltage drop of the touch layer.

SUMMARY OF INVENTION

Technical Problem

Embodiments of the present disclosure provide a display panel and a display device for alleviating a technical problem that a voltage drop of a touch layer is large due to a large overlapping area of connection lines and touch electrodes, in an existing OLED display device.

Technical Solution

To solve the above problems, the present disclosure provides the following technical solutions:

Embodiments of the present disclosure provides a display panel, comprising:
a substrate;
a driving circuit layer disposed on a side of the substrate;
a light-emitting layer disposed on a side of the driving circuit layer away from the substrate;
a packaging layer disposed on a side of the light-emitting layer away from the driving circuit layer; and
a touch layer disposed on a side of the packaging layer away from the light-emitting layer,
wherein the touch layer comprises a touch metal layer, a connection wiring layer, an insulating layer located between the touch metal layer and the connection wiring layer, the touch metal layer comprises touch metals and bonding lines connecting the touch metals, the connection wiring layer comprises connecting wires, the touch metal is arranged around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line.

In some of the embodiments, in a region where the connecting wire is connected to the bonding line, the connecting wire comprises a first end and a second end, and a projection of a side, at which the first end is not connected to the second end, of the connecting wire on the substrate overlaps with a projection of the bonding line on the substrate.

In some of the embodiments, the bonding line comprises a first end and a second end respectively connected to two touch metals, the first end of the bonding line is connected to a point between the first end of the connecting wire and the second end of the connecting wire, a point between the first end of the bonding line and the second end of the bonding line is connected to the first end of the connecting wire, and the second end of the bonding line is not connected to the connecting wire.

In some of the embodiments, the first end of the bonding line is connected to a midpoint of the connecting wire, a midpoint of the bonding line is connected to the first end of the connecting wire.

In some of the embodiments, the touch metal comprises a first circular ring part, and a first straight part and a second straight part which are connected to the first circular ring part, the bonding line comprises a first semicircular ring part, the second straight part connects the first semicircular ring part and the first circular ring part, in a region where a projection of the connecting wire on the substrate overlaps with a projection of the bonding line on the substrate, the connecting wire comprises a second semicircular ring part and a third straight part connected to the second semicircular ring part, one of intersection points between the third straight parts and the second semicircular ring part is connected to a midpoint of the first semicircular ring part.

In some of the embodiments, in a region where a projection of the connecting wire on the substrate dose not overlap with a projection of the bonding line on the substrate, the connecting wire further comprises a third semicircular ring part, the third straight part connects the second semicircular ring part and the third semicircular ring part, and the third semicircular ring part and the second semicircular ring part are located at same side of the third straight part.

In some of the embodiments, in a region where a projection of the connecting wire on the substrate dose not overlap with a projection of the bonding line on the substrate, the connecting wire further comprises a fourth semicircular ring part, the third straight part connects the second semicircular ring part and the fourth semicircular ring part, and at least a part of the fourth semicircular ring parts and the second semicircular ring parts are located at two sides of the third straight part.

In some of the embodiments, the fourth semicircular ring part and the second semicircular ring part are located at the two sides of the third straight part, and the fourth semicircular ring part and the second semicircular ring part are alternately disposed along a direction of the third straight part.

In some of the embodiments, in a region where a projection of the connecting wire on the substrate dose not overlap with a projection of the bonding line on the substrate, the connecting wire further comprises a second circular ring part, and the third straight part connects the second circular ring part and the second semicircular ring part.

In some of the embodiments, the touch metal comprises a first circular ring part, a first straight part and a second straight part which are connected to the first circular ring part, the bonding line comprises a first semicircular ring part, the second straight part connects the first semicircular ring part and the first circular ring part, in a region where the connecting wire overlaps with the bonding line, the connecting wire comprises an open circular ring part having an opening and a fourth straight part connected to the open circular ring part, a connection point between the fourth straight part and an end of the open circular ring part is connected to a midpoint of the first semicircular ring part.

In some of the embodiments, in a region where a projection of the connecting wire on the substrate dose not overlap with a projection of the bonding line on the substrate, the connecting wire further comprises a third circular ring part, the fourth straight part is connected to the third circular ring part.

In some of the embodiments, the touch metal comprises a first polygon part, and a fifth straight part and a sixth straight part which are connected to the first polygon part, the bonding line comprises a first polyline part, the sixth straight part connects the first polyline part and the first polygon part, in a region where a projection of the connecting wire on the substrate overlaps with a projection of the bonding line on the substrate, the connecting wire comprises a second polyline part and a seventh straight part, an intersection point between the second polyline part and the seventh straight part is connected to a midpoint of the first polyline part.

In some of the embodiments, in a region where a projection of the connecting wire on the substrate dose not overlap with a projection of the bonding line on the substrate, the connecting wire further comprises a third polyline part, the seventh straight part connects the second polyline part and the third polyline part, the second polyline part and the third polyline part are located at same side of the seventh straight part.

In some of the embodiments, in a region where a projection of the connecting wire on the substrate dose not overlap with a projection of the bonding line on the substrate, the connecting wire further comprises a fourth polyline part, the seventh straight part connects the second polyline part and the fourth polyline part, at least a part of the fourth polyline parts and the second polyline parts are located at two side of the seventh straight part.

In some of the embodiments, the fourth polyline part and the second polyline part are located at the two sides of the seventh straight part, and the fourth polyline part and the second polyline part are alternately disposed along a direction of the seventh straight part.

In some of the embodiments, in a region where a projection of the connecting wire on the substrate dose not overlap with a projection of the bonding line on the substrate, the connecting wire further comprises a second polygon part, the seventh straight part connects the second polyline part and the second polygon part.

In some of the embodiments, the bonding line comprises a first end and a second end respectively connected to two touch metals, the first end of the connecting wire is connected to a first point between the first end of the bonding line and the second end of the bonding line, the second end of the connecting wire is connected to a second point between the first end of the bonding line and the second end of the bonding line, and the first point is different from the second point.

Meanwhile, the embodiments of the present disclosure provide a display device which comprises a display panel and an electronic element, the display panel comprises:
a substrate;
a driving circuit layer disposed on a side of the substrate;
a light-emitting layer disposed on a side of the driving circuit layer away from the substrate;
a packaging layer disposed on a side of the light-emitting layer away from the driving circuit layer; and
a touch layer disposed on a side of the packaging layer away from the light-emitting layer,
wherein the touch layer comprises a touch metal layer, a connection wiring layer, an insulating layer located between the touch metal layer and the connection wiring layer, the touch metal layer comprises touch metals and bonding lines connecting the touch metals, the connection wiring layer comprises connecting wires, the touch metal is arranged around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line.

In some of the embodiments, in a region where the connecting wire is connected to the bonding line, the connecting wire comprises a first end and a second end, and a projection of a side, at which the first end is not connected to the second end, of the connecting wire on the substrate overlaps with a projection of the bonding line on the substrate.

In some of the embodiments, the bonding line comprises a first end and a second end respectively connected to two touch metals, the first end of the bonding line is connected to a point between the first end of the connecting wire and the second end of the connecting wire, a point between the first end of the bonding line and the second end of the bonding line is connected to the first end of the connecting wire, and the second end of the bonding line is not connected to the connecting wire.

Advantageous Effects

The present disclosure provides a display panel and a display device; the display panel comprises a substrate, a driving circuit layer, a light-emitting layer, a packaging layer and a touch layer, the driving circuit layer is disposed on one side of the substrate, the light-emitting layer is disposed on one side of the driving circuit layer away from the substrate, the packaging layer is disposed on one side of the light-emitting layer away from the driving circuit layer, and the touch layer is disposed on one side of the packaging layer away from the light-emitting layer, wherein the touch layer comprises a touch metal layer, a connection wiring layer and an insulating layer disposed between the touch metal layer and the connection wiring layer, the touch metal layer comprises touch metals and bonding lines connecting the touch metals, the connection wiring layer comprises connecting wires, the touch metal is disposed around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line. In the present disclosure, the connecting wire is connected to the bonding line through the via hole so as to connect the connecting wire and the touch metal, and the length of the part in which the projection of the connecting wire on the substrate overlaps with the projection of the bonding line on the substrate is less than the length of the bonding line, so that the length of the overlapping part between the connecting wire and the touch metal layer is reduced, thereby reducing the parasitic capacitance and the voltage drop, and alleviating the problem that the voltage drop of the touch layer is large.

DESCRIPTION OF DRAWINGS

The technical solutions and other beneficial effects of the present disclosure will be apparent from the detailed description of the specific embodiments of the present disclosure with reference to the accompanying drawings.

DETAILED DESCRIPTION OF EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

The embodiment of the present disclosure provides a display panel and a display device to alleviate the technical problems that a voltage drop of a touch layer is large due to a large overlapping area of connection lines and touch electrodes, in an existing OLED display device.

Figure 1:
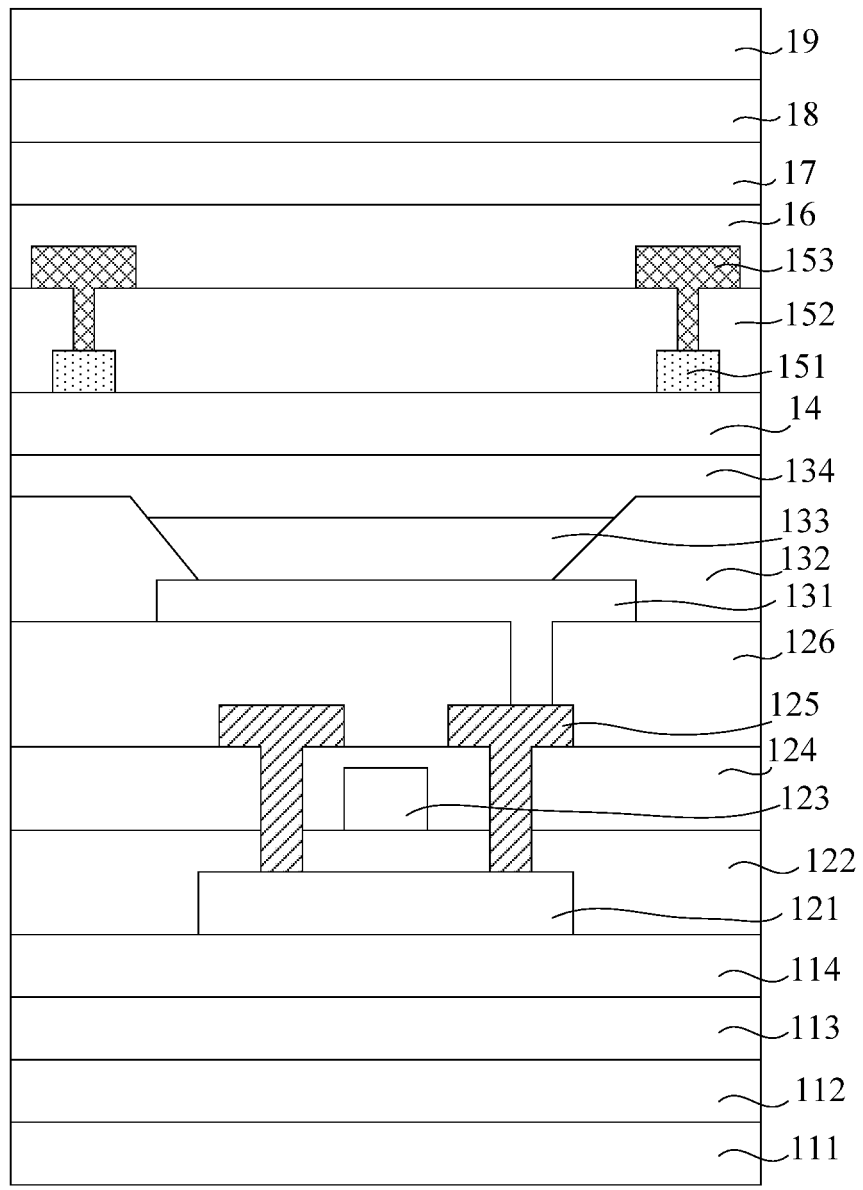
FIG. 1 is a first schematic diagram of a display panel provided by an embodiment of the present disclosure.
Figure 2:
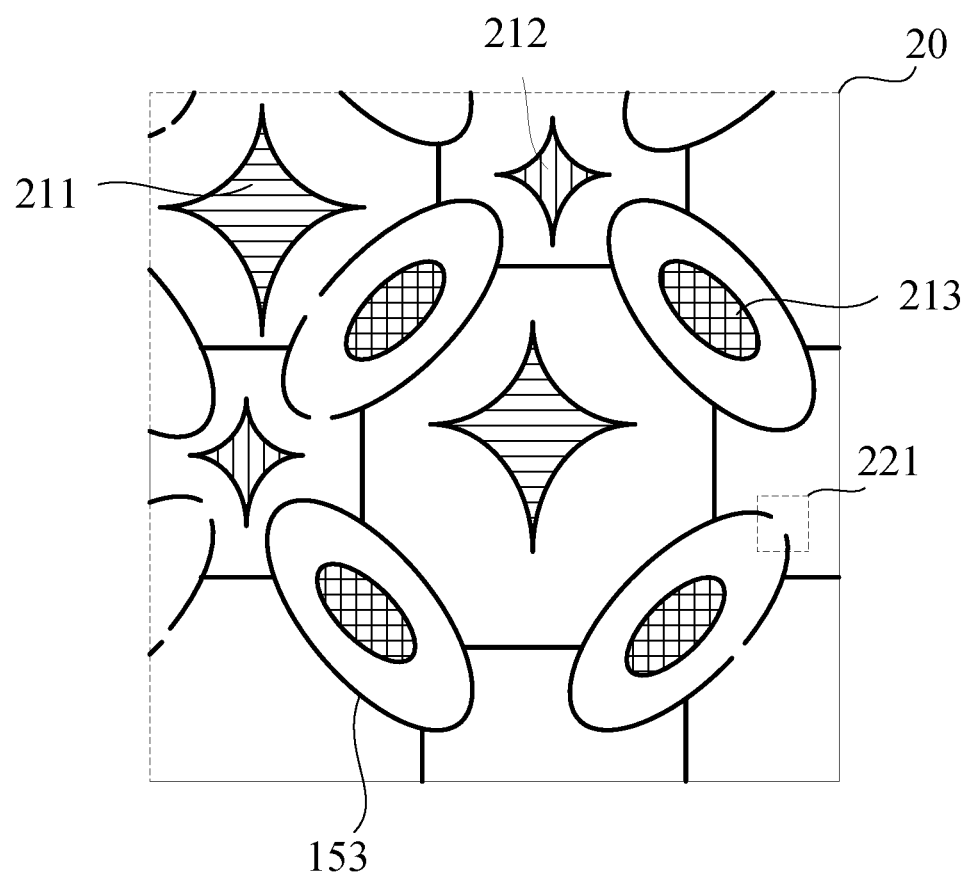
FIG. 2 is a second schematic diagram of a display panel provided by an embodiment of the present disclosure.

As shown in FIGS. 1 to 5, the embodiment of the present disclosure provides a display panel comprising:
- a substrate 11;
- a driving circuit layer 12 disposed on a side of the substrate 11;
- a light-emitting layer 13 disposed on a side of the driving circuit layer 12 away from the substrate 11;
- a packaging layer 14 disposed on a side of the light-emitting layer 13 away from the driving circuit layer 12; and
- touch layer 15 disposed on a side of the packaging layer 14 away from the light-emitting layer 13,
- wherein the touch layer 15 comprises a touch metal layer 153, a connection wiring layer 151, an insulating layer 152 located between the touch metal layer 153 and the connection wiring layer 151, the touch metal layer 153 comprises touch metals 31 and bonding lines 32 connecting the touch metals 31, the connection wiring layer 151 comprises connecting wires 41, the touch metal 31 is arranged around a sub-pixel of the display panel (e.g., the touch metal of the touch metal layer 153 in FIG. 2 is arranged around a green sub-pixel 213), the connecting wire 41 passes through a via hole of the insulating layer 152 and is connected to the bonding line 32, and a length of a part in which a projection of the connecting wire 41 on the substrate 11 overlaps with a projection of the bonding line 32 on the substrate 11 is less than a length of the bonding line 32.

The present disclosure provides a display panel, the display panel realizes the connection between the connecting wire and the touch metal by connecting the connecting wire and the bonding line through the via hole, and makes the length of the part in which the projection of the connecting wire on the substrate overlaps with the projection of the bonding line on the substrate less than the length of the bonding line, so that the length of the overlapping part between the connecting wire and the touch metal layer is reduced, thereby reducing the parasitic capacitance and the voltage drop, and alleviating the problem that the voltage drop of the touch layer is large.

It should be noted that, in the embodiment of the present disclosure, the touch metal formed by the touch electrode layer is used to receive the touch signal, the bonding line is used to connect different touch metals to achieve uniformity of the voltage drop of the touch metal, and the connecting wire formed by the connection wiring layer is used to transmit the touch signal, that is, in the present disclosure, the overlapping area of the connecting line and the touch electrode mentioned in the technical problem of the present disclosure refers to: the area where the connecting wire overlaps with the touch metal and the bonding line.

In one embodiment, in the area where the connecting wire is connected to the bonding line, the connecting wire comprises a first end and a second end, and there is a portion that a projection of a side at which the first end is not connected to the second end on the substrate does not overlap with a projection of the bonding line on the substrate.

Figure 5:
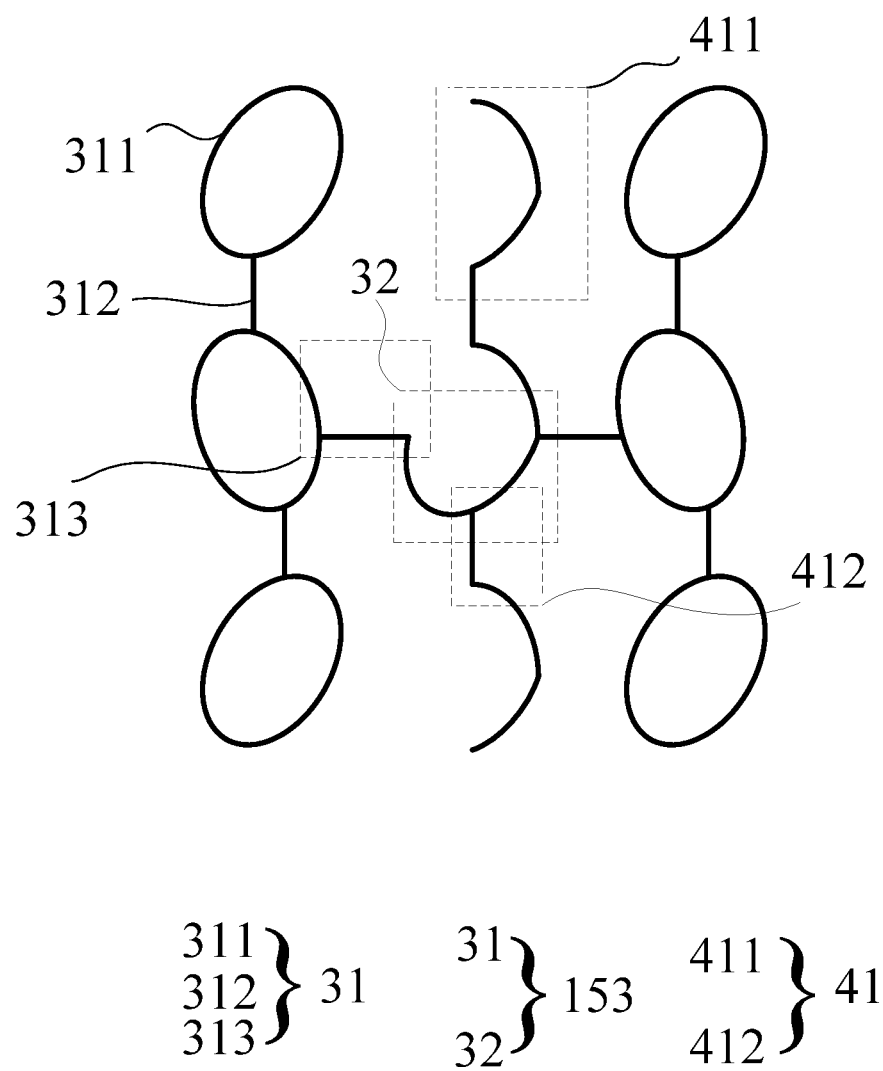
FIG. 5 is a first schematic diagram of a touch layer provided by an embodiment of the present disclosure.

Specifically, as shown in FIG. 5, in the region where the connecting wire 41 is connected to the bonding line 32, both the first end and the second end of the connecting wire 41 refer to the junction point between a second semicircular ring part 411 and a third straight part 412, and it can be seen from FIG. 5 that there is a portion that the projection of the side (i.e., the conductive-free portion located at left side of the third straight part 412), at which the first end is not connected to the second end, of the connecting wire 41 on the substrate overlaps with the projection of the bonding line 32 on the substrate.

Figure 8:
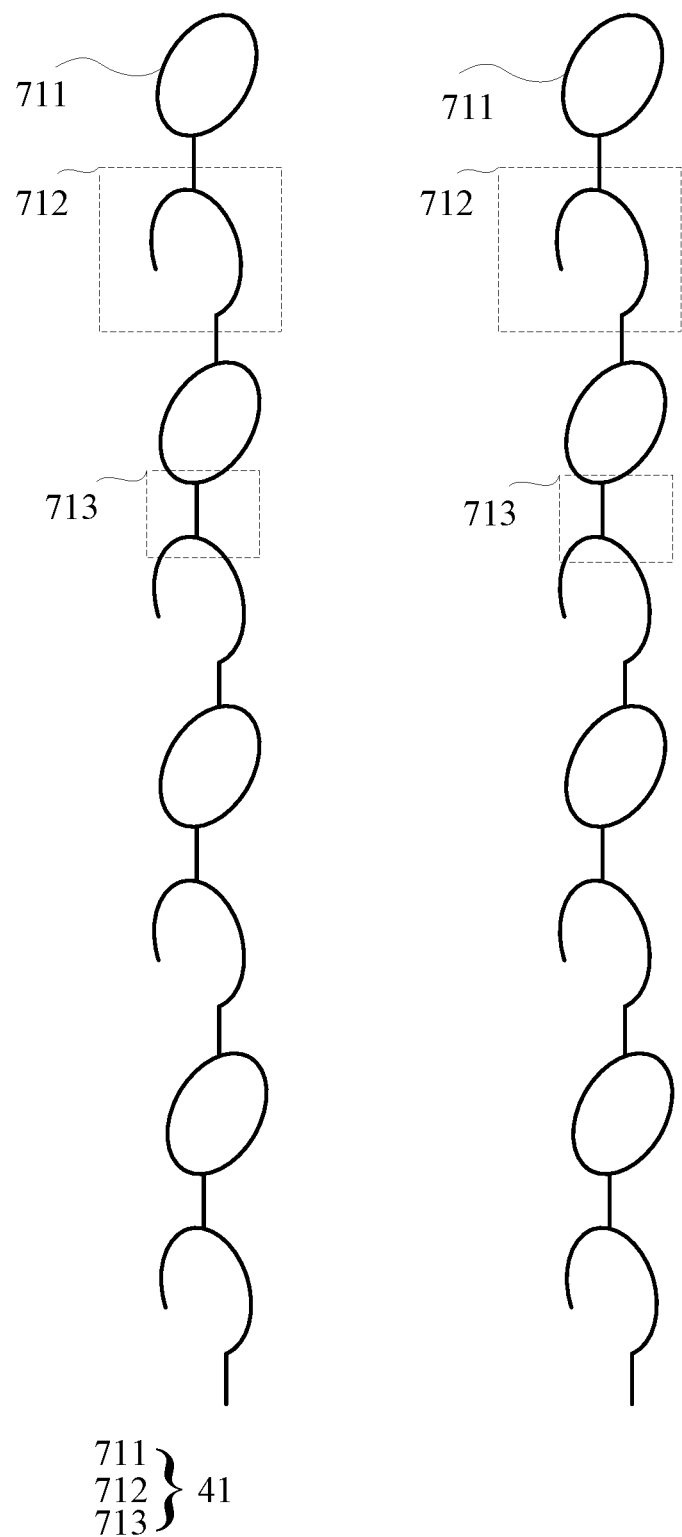
FIG. 8 is a fourth schematic diagram of a connection wiring layer provided by an embodiment of the present disclosure.
Figure 9:
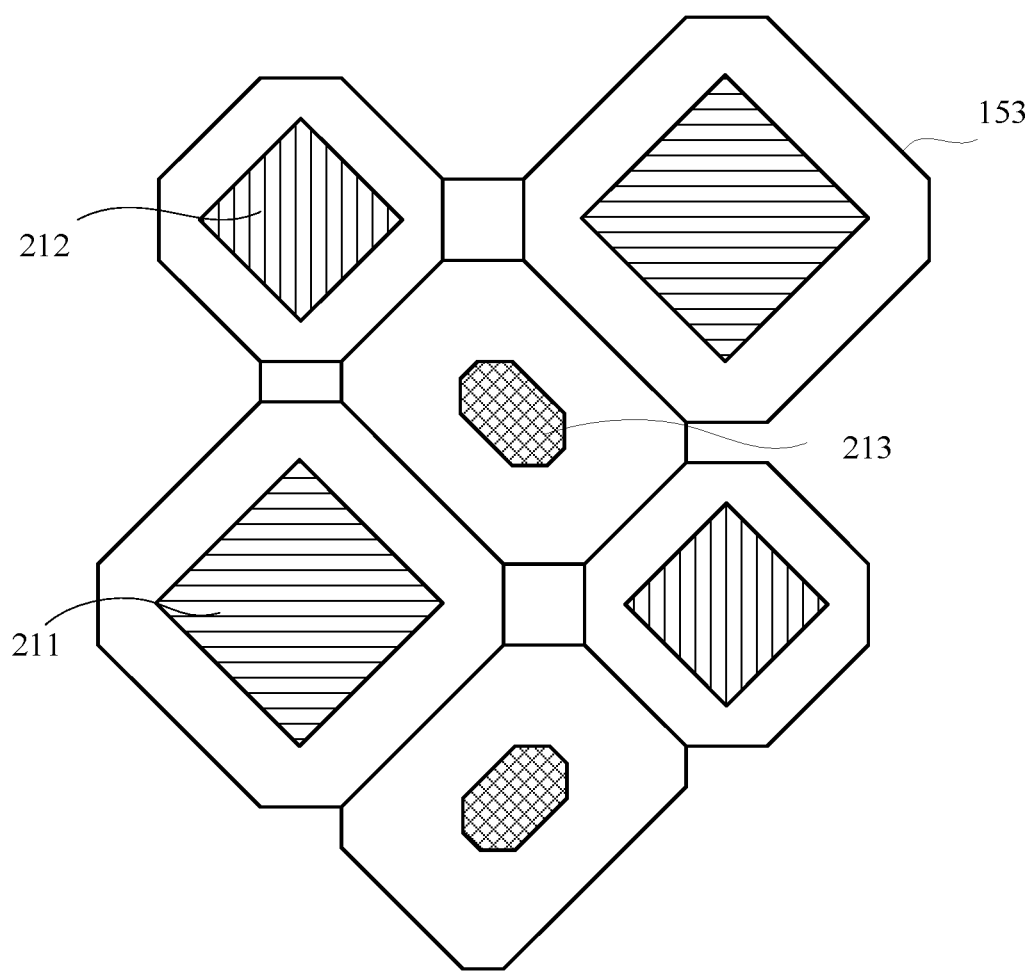
FIG. 9 is a third schematic diagram of a display panel provided by an embodiment of the present disclosure.

Specifically, as for the connecting wire shown in FIG. 8, the first end and the second end of the connecting wire 41 refer to two end points of the opening of the open ring portion 712 respectively, one end point thereof is connected to a fourth straight part 713, and the other end point thereof is not connected to the fourth straight part 713.

In the embodiment of the present disclosure, the connecting wires are disconnected from both ends of the connecting wires in the region where the connecting wire is connected to the bonding line, and there is an overlapping portion between an opening formed by the disconnection (the region where the wire is not provided) and the projection of the bonding line on the substrate, so that the overlapping area between the connecting wire and the bonding line is reduced, and the problem that the touch layer voltage drop is large is alleviated.

In one embodiment, the bonding line comprises a first end and a second end respectively connected to two touch metals, the first end of the bonding line is connected to a point between the first end and the second end of the connecting wire, a point between the first end and the second end of the bonding line is connected to the first end of the connecting wire, and the second end of the bonding line is not connected to the connecting wire. That is, the first end of the bonding line is connected to a point other than the first end and the second end of the connecting wire, and the second end of the bonding line is not connected to the connecting wire, so that there is a non-overlapping portion between the bonding line and the connecting wire, the overlapping area between the bonding line and the connecting wire is reduced, and the voltage drop of the touch layer is reduced.

Specifically, as shown in FIGS. 5, a first end (that is, connection point at right side of two connection points between the bonding line 32 and the second straight part 313) of the bonding line 32 is connected to a midpoint of the connecting wire 41, and a midpoint of the bonding line 32 is connected to a first end of the third straight part 412.

Figure 3:
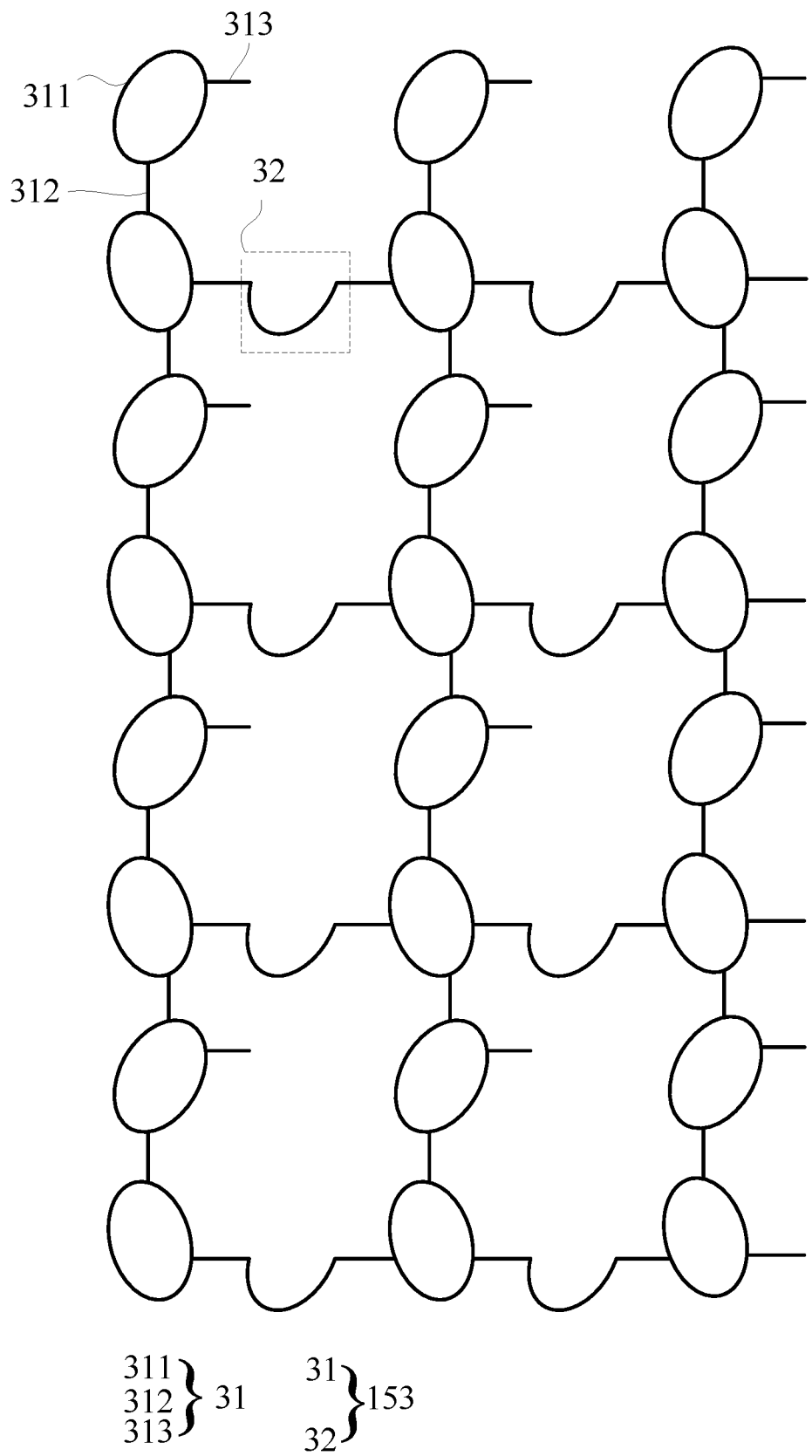
FIG. 3 is a first schematic diagram of a touch metal layer provided by an embodiment of the present disclosure.
Figure 4:
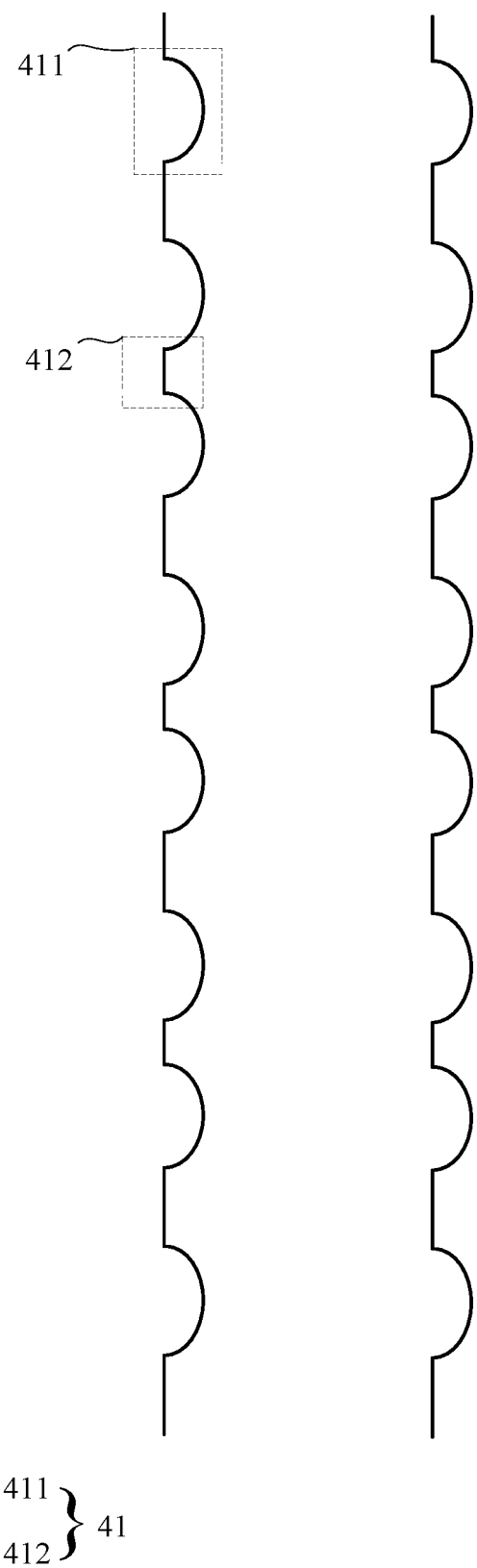
FIG. 4 is a first schematic diagram of a connection wiring layer provided by an embodiment of the present disclosure.

As shown in FIG. 3, the length of the bonding line 32 is the length of the semicircular ring, as shown in FIG. 4, the length of the connection wire 41 is the length of the semicircular ring and the straight line, as shown in FIG. 5, the bonding line 32 and the connecting wire 41 partially overlap each other, and the length of the part in which the projection of the connecting wire 41 on the substrate 11 overlaps with the projection of the bonding line 32 on the substrate 11 is less than the length of the bonding line 32 (the length of the part in which the projection of the connecting wire 41 on the substrate 11 overlaps with the projection of the bonding line 32 on the substrate 11 in FIG. 5 is one half of the length of the semicircular ring, and the length of the bonding line is the length of the semicircular ring).

As shown in FIG. 2, it is shown as an example that the sub-pixel is of elliptical or arc structure, and the corresponding touch metal, bonding line and connecting wire are of at least one of elliptical and arc structure, as can be seen from FIG. 2, the green sub-pixel 213 is of elliptical shape, the red sub-pixel 212 and the blue sub-pixel 211 are of arc structure. Accordingly, as shown in FIGS. 3 and 4, the touch metal 31 is composed of an ellipse shape and a straight line, bonding line 32 is composed of a semi-ellipse shape, and the connecting wire 41 is composed of an arc and a straight line.

It should be noted that in FIG. 2, the frame line 20 represents the cutting portion of the touch layer 15, and the opening 221 represents that the portions located on both sides of the opening 221 are two touch units.

It should be noted that, in the accompanying drawings of the embodiments of the present application, the shape of the touch metal, the bonding line and the connecting wire is shown as an elliptical ring and/or a semi-elliptical ring, but the touch metal, the bonding line and the connecting wire may also be a circular ring and/or a semi-circular ring. The circular ring part and the semicircular ring part in the following embodiments do not limit the shape of the touch metal, the bonding line, and the connecting wire as the circular ring and the semicircular ring, and the shape of the touch metal, the bonding line, and the connecting wire may be a circular ring, a semicircular ring, a quasi-circular ring, a quasi-semicircular ring, an elliptical ring, a semi-elliptical ring, a quasi-elliptical ring and a quasi-semielliptical ring.

In one embodiment, as shown in FIGS. 3 to 5, the touch metal 31 comprises a first circular ring part 311, and a first straight part 312 and a second straight part 313 connected to the first circular ring part 311, the bonding line 32 comprises a first semicircular ring part, the second straight part 313 connects the first semicircular ring part and the first circular ring part 311, the connecting wire 41 comprises a second semicircular ring part 411 and a third straight part 412 connected to the second semicircular ring part 411 in an area where the projection of the connecting wire 41 on the substrate 11 overlaps with the projection of the bonding line 32 on the substrate 11, and one of the boundary points of the third straight part 412 and the second semicircular ring part 411 is connected to the midpoint of the first semicircular ring part.

Specifically, as shown in FIG. 3, the touch metal comprises a first circular ring part having an elliptical shape, a first straight part and a second straight part, and the corresponding bonding line comprises a first semicircular ring part having a semielliptical shape. As shown in FIG. 4, the connecting wire is designed to comprise a second semicircular ring part 411 having a semielliptical shape/a quasi-semielliptical shape and a third straight part 412. As shown in FIG. 5, the second semicircular ring part is arranged in a direction in which the touch metal is arranged, and the bonding line is arranged in a direction perpendicular to the direction in which the touch metal is arranged, so that the bonding line and the connecting wire partially overlap each other, and the length of the overlapping portion is one half of the length of the first semicircular ring part, thereby reducing the length of the overlapping portion of the connecting wire and the touch metal layer, and reducing the voltage drop. Since one of the boundary points between the third straight part and the second semicircular ring part is connected to the midpoint of the first semicircular ring part, the area of the via hole is larger, and the contact between the connecting wire and the bonding line is good, so as to avoid occurrence of poor contact or broken wiring.

Compared with the existing overlapping portions between the connecting wire and the bonding line having a length equal to or greater than the length of the bonding line, or the existing overlapping portions between the connecting wire and the bonding line having a length equal to the length of the connecting wire, the embodiment of the present disclosure reduces the voltage drop of the touch layer by making the length of the overlapping portions of the connecting wire and the bonding line less than the length of the bonding line.

The above-described embodiment will be described with an example in which one of the boundary points between the third straight part and the second semicircular ring part is connected to the midpoint of the first semicircular ring part, that is, the length of the overlapping portion between the projection of the connecting wire on the substrate and the projection of the bonding line on the substrate is equal to one half of the length of the bonding line, but in the embodiment of the present disclosure, in order to further reduce the length of the overlapping portion between the projection of the connecting wire on the substrate and the projection of the bonding line on the substrate, one of the boundary points between the third straight part and the second semicircular ring part may be connected to any point of the first semicircular ring part in the direction away from the midpoint along the opening of the second semicircular ring part, and in this case, the shape and the length of the connecting wire may be changed correspondingly to avoid overlapping between the connecting wire and the touch metal.

In one embodiment, as shown in FIGS. 1 and 5, in an area where the projection of the connecting wire 41 on the substrate 11 does not overlap with the projection of the bonding line 32 on the substrate 11, the connecting wire 41 further comprises a third semicircular ring part, the third straight part 412 connects the second semicircular ring part 411 and the third semicircular ring part, the third semicircular ring part and the second semicircular ring part 411 are on the same side of the third straight part 412. By disposing the second semicircular ring part and the third semicircular ring part on the same side, the occupied area of the connection wire is reduced, and the possibility that the connecting wire overlaps with the touch metal is reduced.

It should be noted that, for the clarity of the drawings, the third semicircular ring part is not shown in FIGS. 4 and 5, and it will be understood that the semicircular ring part which does not overlap with the bonding line is the third semicircular ring part, and it can be seen from FIG. 4 that the second semicircular ring part and the third semicircular ring part are disposed on the same side of the third straight part.

In one embodiment, the length of the second semicircular ring part and the length of the third semicircular ring part are equal to each other, and the shape of the second semicircular ring part and the shape of the third semicircular ring part are identical to each other.

The above-described embodiment will be described with an example in which the length and shape of the second semicircular ring part are same as the length and shape of the third semicircular ring part, but in the embodiment of the present disclosure, the shape and length of the semicircular ring in the region where the projection of the connecting wire on the substrate does not overlap the projection of the bonding line on the substrate is not limited, and the shape and length of the semicircular ring in the region where the projection of the connecting wire on the substrate overlaps with the projection of the bonding line on the substrate is not limited. In order to avoid contact between the connecting wire and the touch metal, the shapes and lengths of the semicircular rings on the left side and the right side of the straight line may be different from each other. Accordingly, the length of the semicircular ring of the connecting wire is not limited to be equal to the length of the bonding line.

Figure 6:
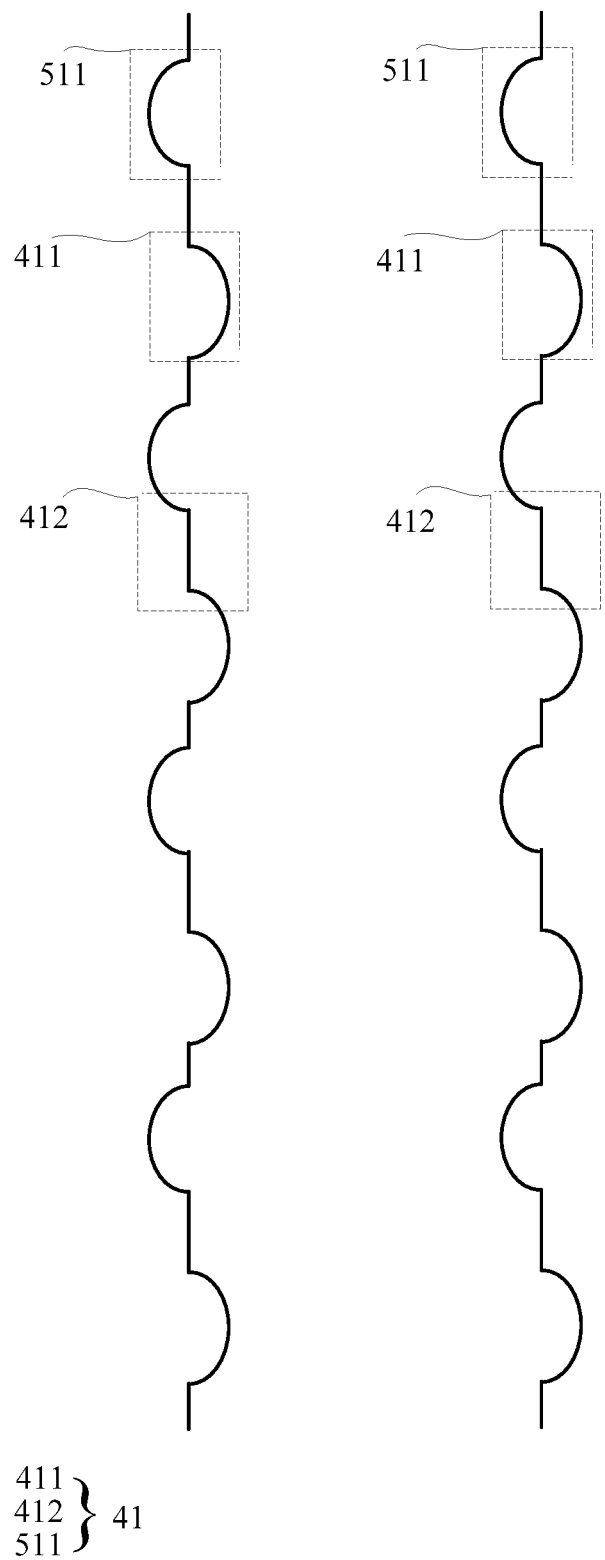
FIG. 6 is a second schematic diagram of a connection wiring layer provided by an embodiment of the present disclosure.

As shown in FIGS. 1 and 6, in an area where the projection of the connecting wire 41 on the substrate 11 does not overlap with the projection of the bonding line 32 on the substrate 11, the connecting wire 41 further comprises a fourth semicircular ring part 511, the third straight part 412 connects the second semicircular ring part 411 and the fourth semicircular ring part 511, and at least parts of the fourth semicircular ring part 511 and the second semicircular ring part 411 are located on both sides of the third straight part 412. By placing the second semicircular ring part and the fourth semicircular ring part on both sides of the third straight part, the second semicircular ring part is connected to the bonding line, and the fourth semicircular ring part does not overlap with the bonding line, so that a large length of the overlapping portion between the bonding line and the connecting wire is avoided, and the voltage drop of the touch layer is reduced.

In one embodiment, as shown in FIG. 6, the fourth semicircular ring part 511 and the second semicircular ring part 411 are located on both sides of the third straight part 412, and the fourth semicircular ring part 511 and the second semicircular ring part 411 are disposed alternately in a direction of the three straight part 412. When the bonding lines are disposed at the same interval along the touch metal, the second semicircular ring parts of the connecting wire are disposed at the same interval and has an overlapping portions with the bonding lines, and the fourth semicircular ring parts in the region where the connecting wire does not overlap with the bonding line are disposed on the other side of the third straight part, so that the length of the overlapping portion between the connecting wire and the touch metal layer is reduced, the parasitic capacitance is reduced, and the voltage drop is reduced.

The above-described embodiment that the second semicircular ring part and the fourth semicircular ring part are alternately disposed in the direction of the third straight part are described in detail. In the embodiment of the present disclosure, the second semicircular ring part and the fourth semicircular ring part may also be disposed at unequal intervals, for example, a part of the fourth semicircular ring part and the second semicircular ring part are located on the same side of the third straight part, and another part of the fourth semicircular ring part and the second semicircular ring part are located on both sides of the third straight part.

Figure 7:
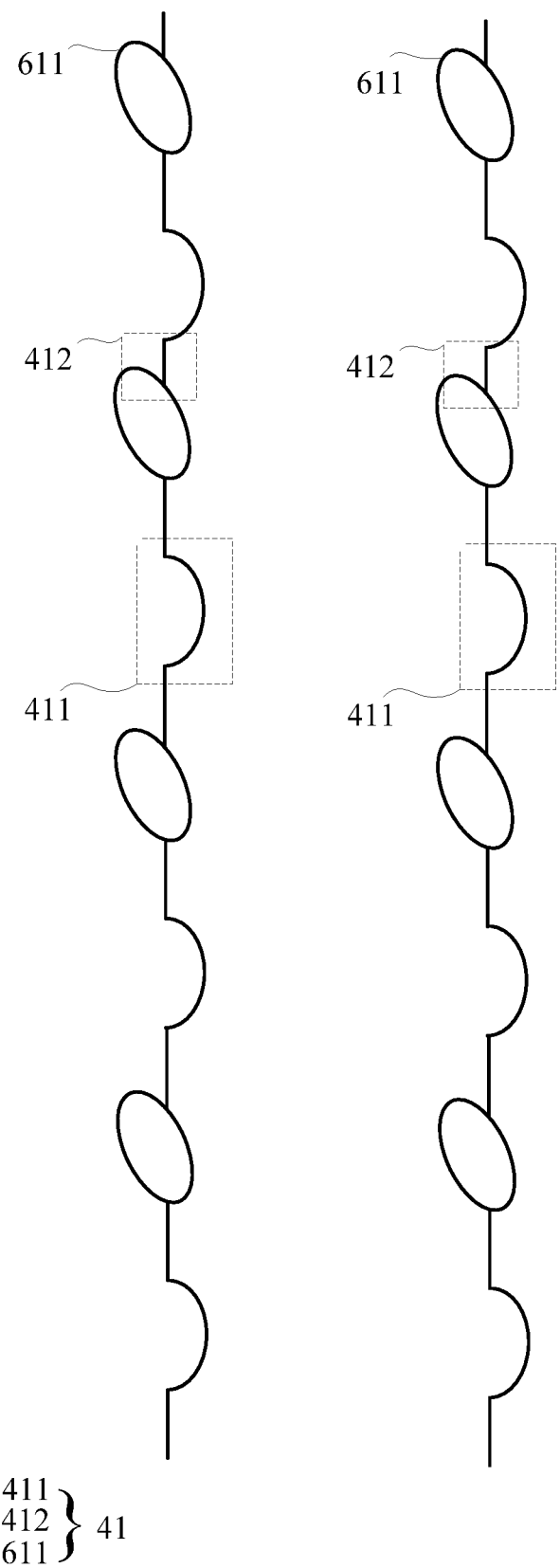
FIG. 7 is a third schematic diagram of a connection wiring layer provided by an embodiment of the present disclosure.

In one embodiment, as shown in FIGS. 1 and 7, in an area where the projection of the connecting wire 41 on the substrate 11 does not overlap with the projection of the bonding line 32 on the substrate 11, the connecting wire 41 further comprises a second circular ring part 611, and the third straight part 412 connects the second circular ring part 611 and the second semicircular ring part 411. In a region where the projection of the connecting wire on the substrate does not overlap with the projection of the bonding line on the substrate, the connection wire may be provided in the shape of a circular ring, an elliptical ring, a quasi-circular ring, or a quasi-elliptical ring, thereby reducing the resistance of the connecting wire.

In one embodiment, as shown in FIGS. 1, 3 and 8, the touch metal 31 comprises a first circular ring part 311, a first straight part 312 and a second straight part 313 which are connected to the first circular ring part 311, the bonding line 32 comprises a first semicircular ring part, the second straight part 313 connects the first semicircular ring part and the first circular ring part 311, and in an area where the connecting wire 41 overlaps with the bonding line 32, the connecting wire 41 comprises an open circular ring portion 712 having an opening and a fourth straight part 713 connected to the open circular ring part 712, and a connection point between the fourth straight part 713 and an end point of the open circular ring part 712 is connected to a midpoint of the first semicircular ring part. By connecting the connection point between the fourth straight part and the end point of the open circular ring part with the midpoint of the first semicircular ring part, the length of the overlapping portion between the connecting wire and the bonding line is less than the length of the bonding line, thereby reducing the parasitic capacitance and reducing the voltage drop of the touch layer.

In one embodiment, the length of the open circular ring part is in the range of one-half to three-quarters of the length of the first circular ring part, taking into account that the length of the bonding line is one-half of the circular ring, the length of the open circular ring part is in the range of one-half to three-quarters of the length of the first circular ring part, the open circular ring can be vertically connected, and the length of the overlapping portion between the open circular ring part and the bonding line is less than or equal to one-half of the length of the bonding line, thereby reducing parasitic capacitance.

In one embodiment, as shown in FIGS. 1 and 8, in an area where the projection of the connecting wire 41 on the substrate 11 does not overlap with the projection of the bonding line 32 on the substrate 11, the connecting wire 41 further comprises a third circular ring part 711, and the fourth straight part 713 is connected to the third circular ring part 711. The region where the projection of the connecting wire on the substrate does not overlap with the projection of the bonding line on the substrate are provided in the shape of a circular ring, a quasi-circular ring, an elliptical ring, a quasi-elliptical ring, thereby reducing the resistance of the connecting wire.

In one embodiment, as shown in FIGS. 1, 9, 10, 11 and 12, the touch metal 31 includes a first polygon part 811, and a fifth straight part 812 and a sixth straight part 813 which are connected to the first polygon part 811, the bonding line 32 comprises a first polyline part, the sixth straight part 813 connects the first polyline part and the first polygon part 811, and in an area where a projection of the connecting wire 41 on the substrate 11 overlaps with a projection of the bonding line 32 on the substrate 11, the connecting wire 41 comprises a second polyline part 911 and a seventh straight part 912, and a junction point between the second polyline part 911 and the seventh straight part 912 is connected to a midpoint of the first polyline part. By connecting the junction point between the second polyline part and the seventh straight part with the midpoint of the first polyline part, the length of the overlapping portion between the connecting wire and the bonding line is one half of the length of the bonding line, so that the length of the overlapping portion between the connecting wire and the touch metal layer is reduced, the parasitic capacitance is reduced, and the voltage drop is reduced.

Figure 10:
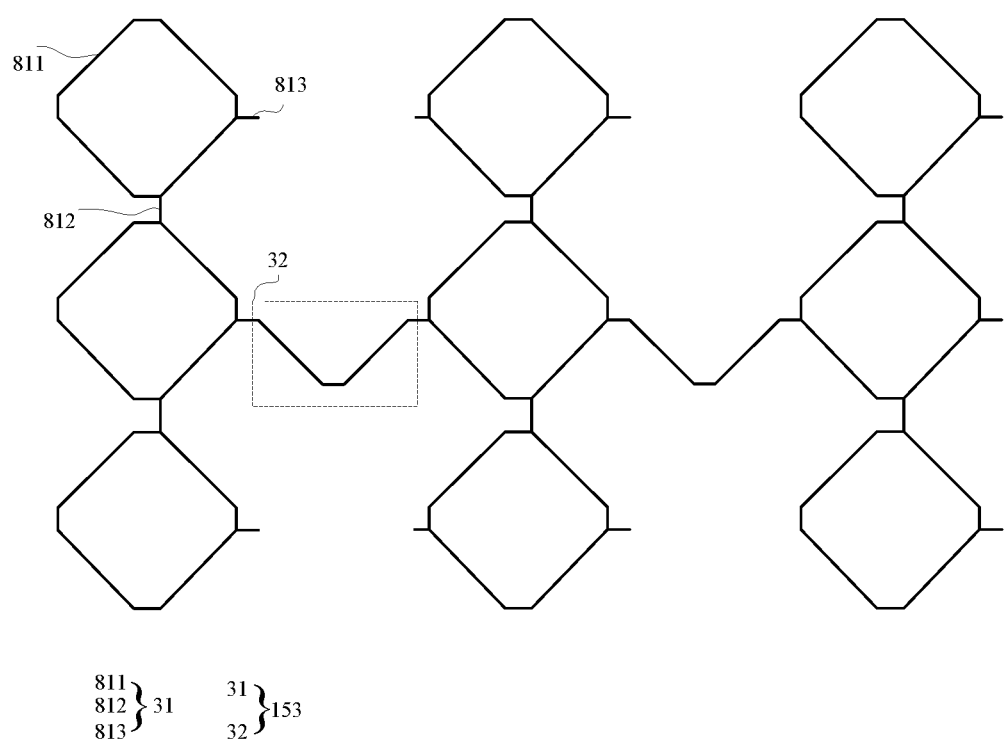
FIG. 10 is a second schematic diagram of a touch metal layer provided by an embodiment of the present disclosure.
Figure 11:
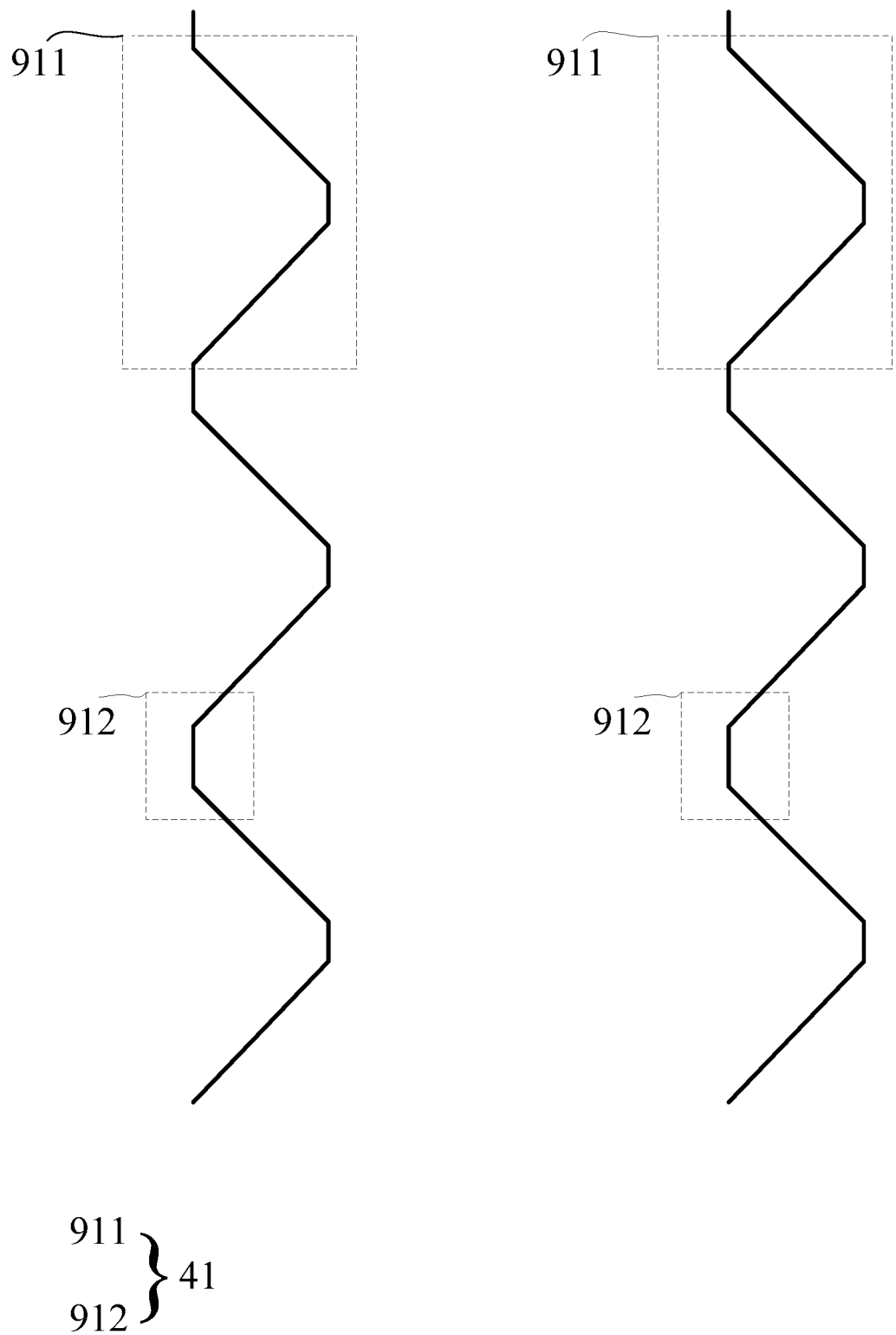
FIG. 11 is a fifth schematic diagram of a connection wiring layer provided by an embodiment of the present disclosure.
Figure 12:
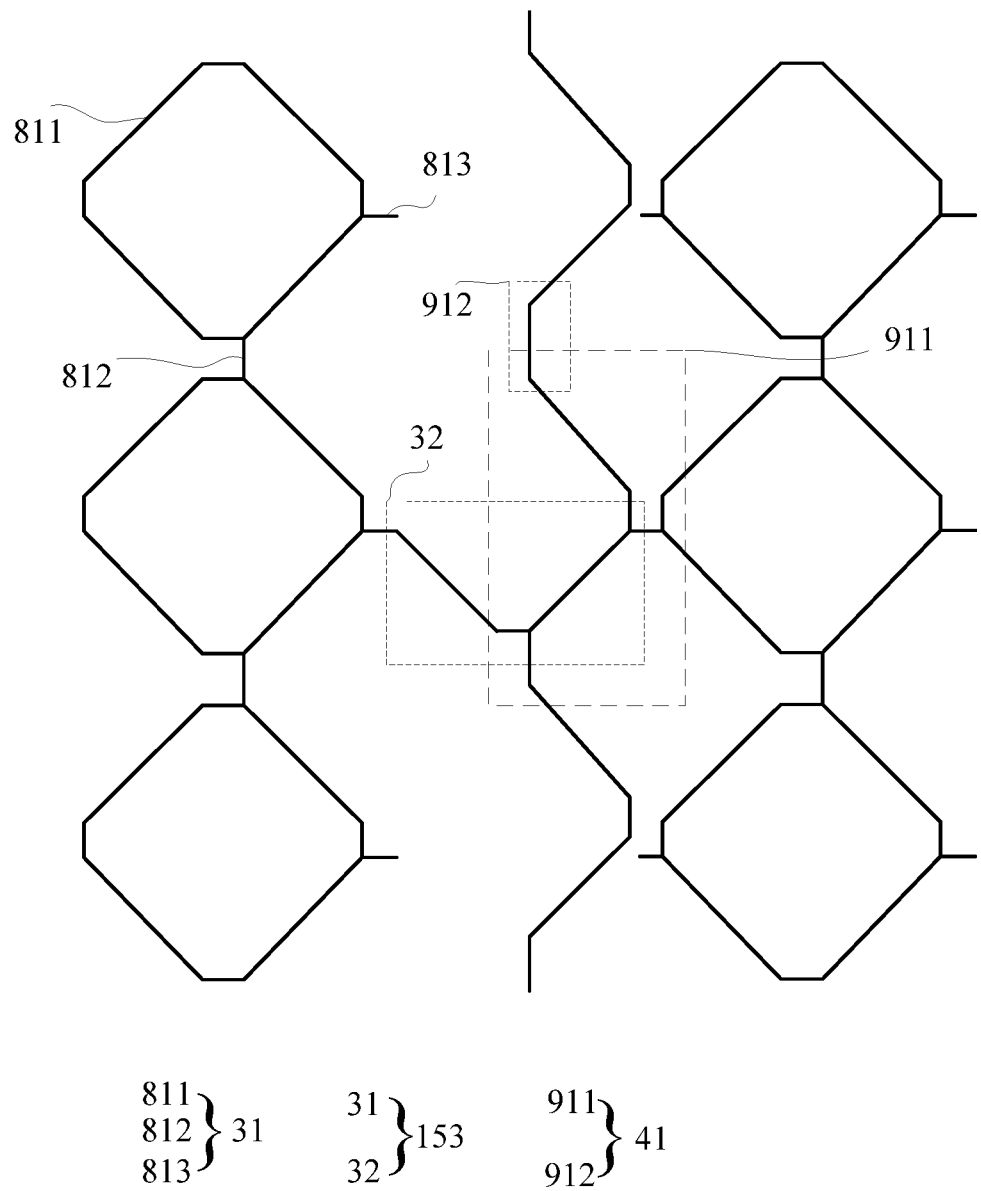
FIG. 12 is a second schematic diagram of a touch layer provided by an embodiment of the present disclosure.

It should be noted that since the bonding line in FIG. 10 is a polyline formed by three straight lines, the length of the overlapping portion between the projection of the connecting wire in FIG. 11 on the substrate and the projection of the bonding line in FIG. 10 on the substrate is less than one-half of the length of the bonding line.

In the embodiment of the present disclosure, considering that the connection portion between sides of the polygon may be a straight line when directly connecting the sides of the polygon, and the line may be easily broken, therefore, in the embodiment of the present disclosure, the sides of the polygon are connected by straight line instead of directly connected, but the embodiment of the present disclosure is not limited thereto, and the sides of the polygon may be directly connected to form a quadrilateral, for example, the polygon is diamond.

In one embodiment, as shown in FIGS. 1 and 11, in an area where the projection of the connecting wire 41 on the substrate 11 does not overlap with the projection of the bonding line 32 on the substrate 11, the connecting wire 41 further comprises a third polyline part, the seventh straight part 912 connects the second polyline part 911 and the third polyline part, the second polyline part 911 and the third polyline part are on the same side of the seventh straight part 912. By disposing the second polyline part and the third polyline part on the same side of the seventh straight part, the occupied area of the connection wire is reduced, and the possibility that the connecting wire overlaps with the touch metal is reduced.

Figure 13:
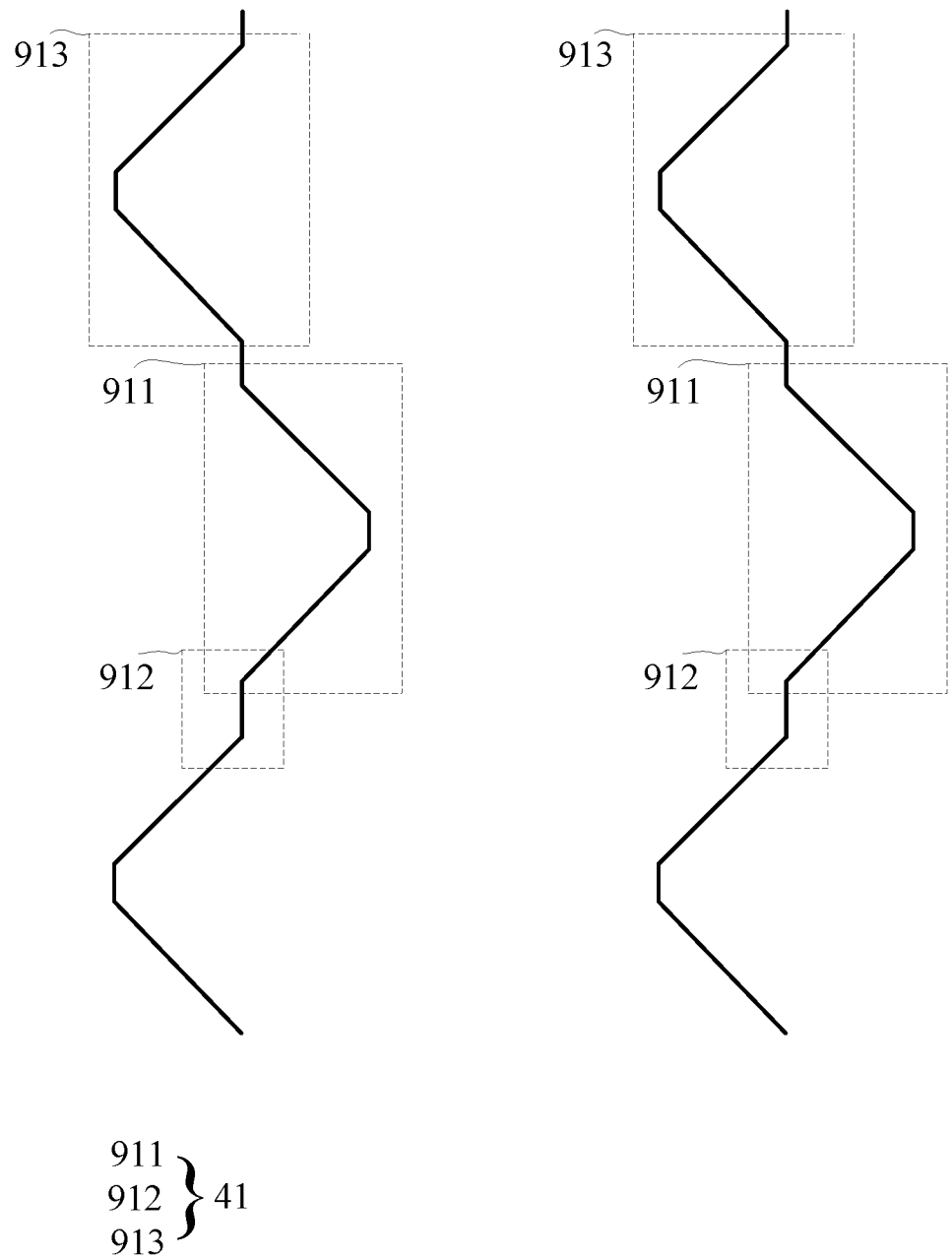
FIG. 13 is a sixth schematic diagram of a connection wiring layer provided by an embodiment of the present disclosure.

In one embodiment, as shown in FIGS. 1 and 13, in an area where the projection of the connecting wire 41 on the substrate 11 does not overlap with the projection of the bonding line 32 on the substrate 11, the connecting wire 41 further comprises a fourth polyline part 913, the seventh straight part 912 connects the second polyline part 911 and the fourth polyline part 913, and at least parts of the fourth polyline part 913 and the second polyline part 911 are located on both sides of the seventh straight part 912. By placing the fourth polyline part and the second polyline part on both sides of the seventh straight part, the second polyline part is connected to the bonding line, and the fourth polyline part does not overlap with the bonding line, so that a large length of the overlapping portion between the bonding line and the connecting wire is avoided, and the voltage drop of the touch layer is reduced.

In one embodiment, as shown in FIG. 13, the fourth polyline part 913 and the second polyline part 911 are located at both sides of the seventh straight part 912, and the fourth polyline part 913 and the second polyline part 911 are disposed alternately in a direction of the seventh straight part 912. When the bonding lines are disposed at the same interval along the touch metal, the second polyline parts of the connecting wire are disposed at the same interval and has an overlapping portions with the bonding lines, and the fourth polyline parts in the region where the connecting wire does not overlap with the bonding line are disposed on the other side of the seventh straight part, so that the length of the overlapping portion between the connecting wire and the touch metal layer is reduced, the parasitic capacitance is reduced, and the voltage drop is reduced.

The above-described embodiment that the second polyline part and the fourth polyline part are alternately disposed in the direction of the seventh straight part are described in detail. In the embodiment of the present disclosure, the second polyline part and the fourth polyline part may also be disposed at unequal intervals, for example, a part of the fourth polyline part and the second polyline part are located on the same side of the seventh straight part, and another part of the fourth polyline part and the second polyline part are located on both sides of the seventh straight part.

Figure 14:
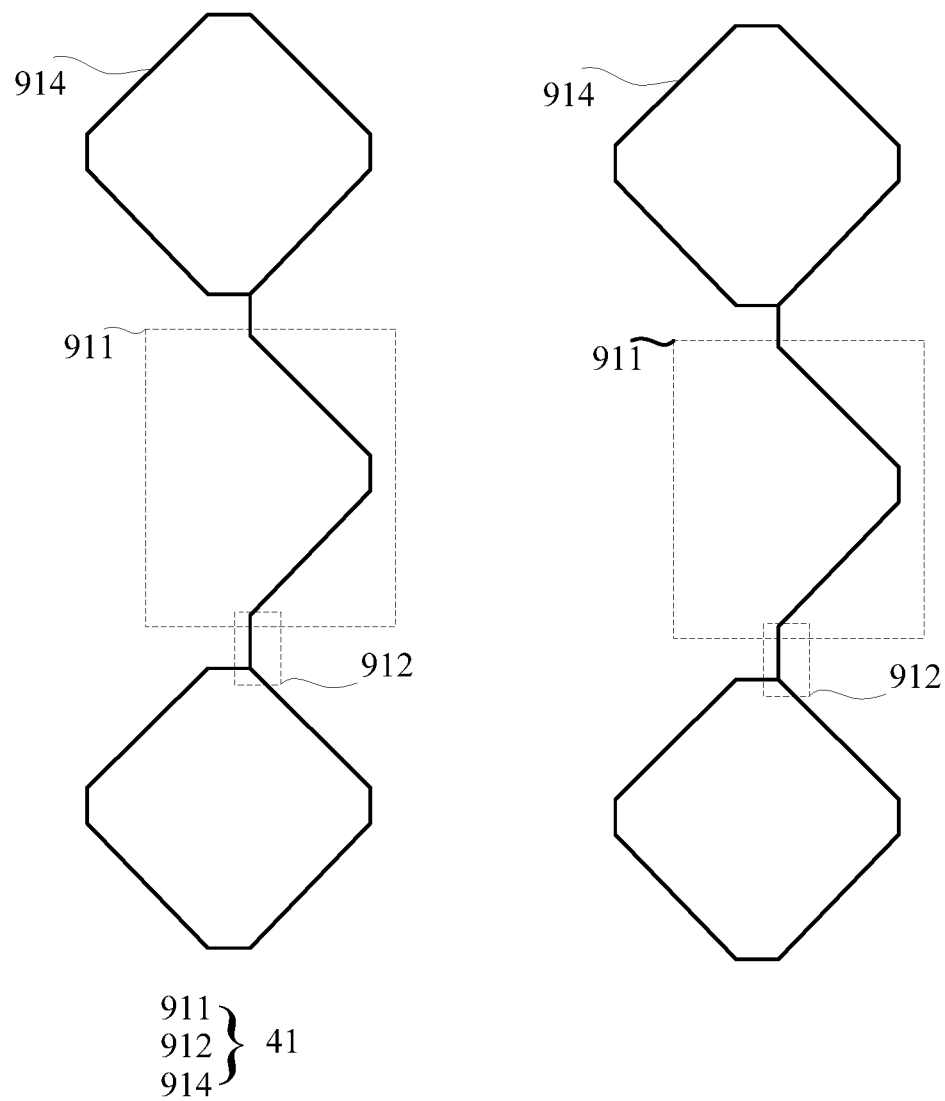
FIG. 14 is a seventh schematic diagram of a connection wiring layer provided by an embodiment of the present disclosure.
Figure 15:
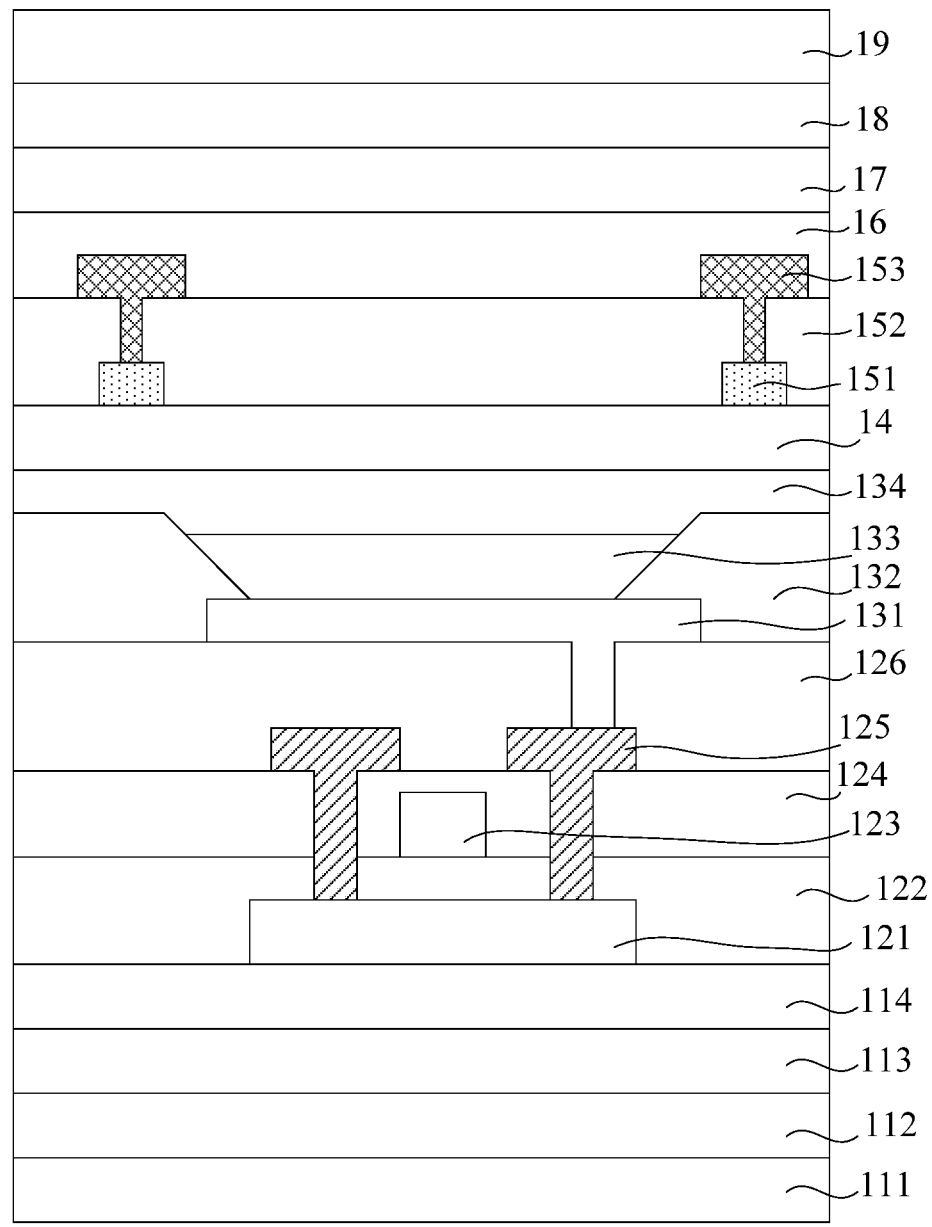
FIG. 15 is a schematic diagram of a display device provided by an embodiment of the present disclosure.

In one embodiment, as shown in FIGS. 1 and 14, in an area where the projection of the connecting wire 41 on the substrate 11 does not overlap with the projection of the bonding line 32 on the substrate 11, the connecting wire 41 further comprises a second polygon part 914, and the seventh straight part 912 connects the second polyline part 911 and the second polygon part 914. A portion in which the connecting wire does not overlap with the bonding line is provided in a polygon, thereby reducing the resistance of the connecting wire.

In the above described embodiment, it is described with an example in which the length of the polyline part of the connecting wire is one-half of the length of the polygon in the overlapping portion between the connecting wire and the bonding line, but in the present disclosure, the length of the polyline part of the connecting wire is not limited, the length of this polyline part may be less than three-fourths of the length of the polygon. The length at which this polyline part can be connected to the bonding line through the via hole is a smaller length.

In one embodiment, the bonding line comprises a first end and a second end respectively connected to two touch metals, the first end of the connecting wire is connected to a first point between the first end and the second end of the bonding line, the second end of the connecting wire is connected to a second point between the first end and the second end of the bonding line, and the first point is different from the second point; that is, two ends of the connecting wire are connected to two points of the bonding line, and the first point is different from the second point, so that the overlapping area between the bonding line and the connecting wire is reduced, and the voltage drop is reduced. In one embodiment, as shown in FIG. 1, the substrate 11 comprises a protective layer 111, a polyimide layer 112, a blocking layer 113 and a buffer layer 114.

In one embodiment, as shown in FIG. 1, the driving circuit layer 12 comprises an active layer 121, a gate insulating layer 122, a gate layer 123, an insulating interlayer 124, a source and drain layer 125 and a planarizing layer 126.

In one embodiment, as shown in FIG. 1, the light-emitting layer 13 comprises a pixel electrode layer 131, a pixel defining layer 132, a luminescence material layer 133 and a common electrode layer 134.

In one embodiment, the packaging layer comprises a first inorganic layer, an organic layer and a second inorganic layer.

In one embodiment, as shown in FIG. 1, the display panel further comprises a passivation layer 16, a polarizing layer 17, an adhesive layer 18, and a cover plate 19.

Meanwhile, as shown in FIGS. 2 to 5 and 15, an embodiment of the present disclosure provides a display device, the display device comprises a display panel and an electronic element 90, the display panel comprising:
  a substrate 11;
  a driving circuit layer 12 disposed on a side of the substrate 11;
  a light-emitting layer 13 disposed on a side of the driving circuit layer 12 away from the substrate 11;
  a packaging layer 14 disposed on a side of the light-emitting layer 13 away from the driving circuit layer 12; and
  touch layer 15 disposed on a side of the packaging layer 14 away from the light-emitting layer 13,
  wherein the touch layer 15 comprises a touch metal layer 153, a connection wiring layer 151, and an insulating layer 152 located between the touch metal layer 153 and the connection wiring layer 151, the touch metal layer 153 comprises touch metals 31 and bonding lines 32 connecting the touch metals 31, the connection wiring layer 151 comprises connecting wires 41, the touch metal 31 is arranged around a sub-pixel of the display panel (e.g., the touch metal of the touch metal layer 153 in FIG. 2 is arranged around a green sub-pixel 213), the connecting wire 41 passes through a via hole of the insulating layer 152 and is connected to the bonding line 32, and a length of a part in which a projection of the connecting wire 41 on the substrate 11 overlaps with a projection of the bonding line 32 on the substrate 11 is less than a length of the bonding line 32.

The present disclosure provides a display device, the display device comprises a display panel and a electronic element, the display panel realizes the connection between the connecting wire and the touch metal by connecting the connecting wire and the bonding line through the via hole, and makes the length of the part in which the projection of the connecting wire on the substrate overlaps with the projection of the bonding line on the substrate less than the length of the bonding line, so that the length of the overlapping part between the connecting wire and the touch metal layer is reduced, thereby reducing the parasitic capacitance and the voltage drop, and alleviating the problem that the voltage drop of the touch layer is large.

In one embodiment, the electronic element comprises a camera under the screen, the corresponding display panel may be formed with vias for lighting.

In one embodiment, in the display device, the touch metal comprises a first circular ring part, and a first straight part and a second straight part which are connected to the first circular ring part, the bonding line comprises a first semicircular ring part, the second straight part connects the first semicircular ring part and the first circular ring part, the connecting wire comprises a second semicircular ring part and a third straight part connected to the second semicircular ring part in an area where the projection of the connecting wire on the substrate overlaps with the projection of the bonding line on the substrate, and one of the boundary points of the third straight part and the second semicircular ring part is connected to the midpoint of the first semicircular ring part.

In one embodiment, in an area where the projection of the connecting wire on the substrate does not overlap with the projection of the bonding line on the substrate, the connecting wire further comprises a third semicircular ring part, the third straight part connects the second semicircular ring part and the third semicircular ring part, the third semicircular ring part and the second semicircular ring part are on the same side of the third straight part, in the display device.

In one embodiment, in an area where the projection of the connecting wire on the substrate does not overlap with the projection of the bonding line on the substrate, the connecting wire further comprises a fourth semicircular ring part, the third straight part connects the second semicircular ring part and the fourth semicircular ring part, and at least parts of the fourth semicircular ring part and the second semicircular ring part are located on both sides of the third straight part, in the display device.

In one embodiment, the fourth semicircular ring part and the second semicircular ring part are located on both sides of the third straight part, and the fourth semicircular ring part and the second semicircular ring part are disposed alternately in a direction of the three straight part, in the display device.

In one embodiment, in an area where the projection of the connecting wire on the substrate does not overlap with the projection of the bonding line on the substrate, the connecting wire further comprises a second circular ring part, and the third straight part connects the second circular ring part and the second semicircular ring part, in the display device.

In one embodiment, in the display device, the touch metal comprises a first circular ring part, a first straight part and a second straight part which are connected to the first circular ring part, the bonding line comprises a first semicircular ring part, the second straight part connects the first semicircular ring part and the first circular ring part, and in an area where the connecting wire overlaps with the bonding line, the connecting wire comprises an open circular ring portion having an opening and a fourth straight part connected to the open circular ring part, and a connection point between the fourth straight part and an end point of the open circular ring part is connected to a midpoint of the first semicircular ring part.

It can be seen from the above embodiments that:

The embodiments of the present disclosure provides a display panel and a display device; the display panel comprises a substrate, a driving circuit layer, a light-emitting layer, a packaging layer and a touch layer, the driving circuit layer is disposed on one side of the substrate, the light-emitting layer is disposed on one side of the driving circuit layer away from the substrate, the packaging layer is disposed on one side of the light-emitting layer away from the driving circuit layer, and the touch layer is disposed on one side of the packaging layer away from the light-emitting layer, wherein the touch layer comprises a touch metal layer, a connection wiring layer and an insulating layer disposed between the touch metal layer and the connection wiring layer, the touch metal layer comprises touch metals and bonding lines connecting the touch metals, the connection wiring layer comprises connecting wires, the touch metal is disposed around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line. In the present disclosure, the connecting wire is connected to the bonding line through the via hole so as to connect the connecting wire and the touch metal, and the length of the part in which the projection of the connecting wire on the substrate overlaps with the projection of the bonding line on the substrate is less than the length of the bonding line, so that the length of the overlapping part between the connecting wire and the touch metal layer is reduced, thereby reducing the parasitic capacitance and the voltage drop, and alleviating the problem that the voltage drop of the touch layer is large.

In the above-described embodiments, the descriptions of the various embodiments are laid particular emphasis respectively, and portions of some embodiments that are not detailed may be referred to the related descriptions of other embodiments.

The display panel and the display device provided in the embodiments of the present disclosure are described in detail above, the principles and embodiments of the present disclosure are explained by using specific examples, and the description of the above embodiments is only used to help understand the technical solutions and core ideas of the present disclosure; those of ordinary skill in the art should understand that it is still possible to modify the technical solutions recorded in the foregoing embodiments, or to replace some of the technical features with equivalent ones; and these modifications or replacements do not cause the essence of the corresponding technical solutions to deviate from the scope of the technical solutions of the embodiments of the present disclosure.

What is claimed is:

1. A display panel, comprising:
a substrate;
a driving circuit layer disposed on a side of the substrate;
a light-emitting layer disposed on a side of the driving circuit layer away from the substrate;
a packaging layer disposed on a side of the light-emitting layer away from the driving circuit layer; and
a touch layer disposed on a side of the packaging layer away from the light-emitting layer,
wherein the touch layer comprises a touch metal layer, a connection wiring layer, an insulating layer located between the touch metal layer and the connection wiring layer, the touch metal layer comprises touch metals and bonding lines connecting the touch metals, the connection wiring layer comprises connecting wires, the touch metal is arranged around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line,
wherein, in a region where the connecting wire is connected to the bonding line, the connecting wire comprises a first end and a second end, and a projection of a side, at which the first end is not connected to the second end, of the connecting wire on the substrate overlaps with a projection of the bonding line on the substrate.

2. The display panel of claim 1, wherein the bonding line comprises a first end and a second end respectively connected to two touch metals, the first end of the bonding line is connected to a point between the first end of the connecting wire and the second end of the connecting wire, a point between the first end of the bonding line and the second end of the bonding line is connected to the first end of the connecting wire, and the second end of the bonding line is not connected to the connecting wire.

3. The display panel of claim 2, wherein the first end of the bonding line is connected to a midpoint of the connecting wire, a midpoint of the bonding line is connected to the first end of the connecting wire.

4. The display panel of claim 3, wherein the touch metal comprises a first circular ring part, and a first straight part and a second straight part which are connected to the first circular ring part, the bonding line comprises a first semicircular ring part, the second straight part connects the first semicircular ring part and the first circular ring part, in a region where a projection of the connecting wire on the substrate overlaps with a projection of the bonding line on the substrate, the connecting wire comprises a second semicircular ring part and a third straight part connected to the second semicircular ring part, one of intersection points between the third straight parts and the second semicircular ring part is connected to a midpoint of the first semicircular ring part.

5. The display panel of claim 4, wherein, in a region where a projection of the connecting wire on the substrate dose not overlap with a projection of the bonding line on the substrate, the connecting wire further comprises a third semicircular ring part, the third straight part connects the second semicircular ring part and the third semicircular ring part, and the third semicircular ring part and the second semicircular ring part are located at same side of the third straight part.

6. The display panel of claim 4, wherein, in a region where a projection of the connecting wire on the substrate dose not overlap with a projection of the bonding line on the substrate, the connecting wire further comprises a fourth semicircular ring part, the third straight part connects the second semicircular ring part and the fourth semicircular ring part, and at least a part of the fourth semicircular ring parts and the second semicircular ring parts are located at two sides of the third straight part.

7. The display panel of claim 6, wherein the fourth semicircular ring part and the second semicircular ring part are located at the two sides of the third straight part, and the fourth semicircular ring part and the second semicircular ring part are alternately disposed along a direction of the third straight part.

8. The display panel of claim 4, wherein, in a region where a projection of the connecting wire on the substrate dose not overlap with a projection of the bonding line on the substrate, the connecting wire further comprises a second circular ring part, and the third straight part connects the second circular ring part and the second semicircular ring part.

9. The display panel of claim 3, wherein the touch metal comprises a first circular ring part, a first straight part and a second straight part which are connected to the first circular ring part, the bonding line comprises a first semicircular ring part, the second straight part connects the first semicircular ring part and the first circular ring part, in a region where the connecting wire overlaps with the bonding line, the connecting wire comprises an open circular ring part having an opening and a fourth straight part connected to the open circular ring part, a connection point between the fourth straight part and an end of the open circular ring part is connected to a midpoint of the first semicircular ring part.

10. The display panel of claim 9, wherein, in a region where a projection of the connecting wire on the substrate dose not overlap with a projection of the bonding line on the substrate, the connecting wire further comprises a third circular ring part, the fourth straight part is connected to the third circular ring part.

11. The display panel of claim 3, wherein the touch metal comprises a first polygon part, and a fifth straight part and a sixth straight part which are connected to the first polygon part, the bonding line comprises a first polyline part, the sixth straight part connects the first polyline part and the first polygon part, in a region where a projection of the connecting wire on the substrate overlaps with a projection of the bonding line on the substrate, the connecting wire comprises a second polyline part and a seventh straight part, an intersection point between the second polyline part and the seventh straight part is connected to a midpoint of the first polyline part.

12. The display panel of claim 11, wherein, in a region where a projection of the connecting wire on the substrate dose not overlap with a projection of the bonding line on the substrate, the connecting wire further comprises a third polyline part, the seventh straight part connects the second polyline part and the third polyline part, the second polyline part and the third polyline part are located at same side of the seventh straight part.

13. The display panel of claim 12, wherein, in a region where a projection of the connecting wire on the substrate dose not overlap with a projection of the bonding line on the substrate, the connecting wire further comprises a fourth polyline part, the seventh straight part connects the second polyline part and the fourth polyline part, at least a part of the fourth polyline parts and the second polyline parts are located at two side of the seventh straight part.

14. The display panel of claim 13, wherein the fourth polyline part and the second polyline part are located at the two sides of the seventh straight part, and the fourth polyline part and the second polyline part are alternately disposed along a direction of the seventh straight part.

15. The display panel of claim 11, wherein, in a region where a projection of the connecting wire on the substrate dose not overlap with a projection of the bonding line on the substrate, the connecting wire further comprises a second polygon part, the seventh straight part connects the second polyline part and the second polygon part.

16. The display panel of claim 1, wherein the bonding line comprises a first end and a second end respectively connected to two touch metals, the first end of the connecting wire is connected to a first point between the first end of the bonding line and the second end of the bonding line, the second end of the connecting wire is connected to a second point between the first end of the bonding line and the second end of the bonding line, and the first point is different from the second point.

17. A display device, which comprises a display panel and an electronic element, the display panel comprises:
    a substrate;
    a driving circuit layer disposed on a side of the substrate;
    a light-emitting layer disposed on a side of the driving circuit layer away from the substrate;
    a packaging layer disposed on a side of the light-emitting layer away from the driving circuit layer; and
    a touch layer disposed on a side of the packaging layer away from the light-emitting layer,
    wherein the touch layer comprises a touch metal layer, a connection wiring layer, an insulating layer located between the touch metal layer and the connection wiring layer, the touch metal layer comprises touch metals and bonding lines connecting the touch metals, the connection wiring layer comprises connecting wires, the touch metal is arranged around a sub-pixel of the display panel, the connecting wire passes through a via hole of the insulating layer and is connected to the bonding line, and a length of a part in which a projection of the connecting wire on the substrate overlaps with a projection of the bonding line on the substrate is less than a length of the bonding line,
    wherein, in a region where the connecting wire is connected to the bonding line, the connecting wire comprises a first end and a second end, and a projection of a side, at which the first end is not connected to the second end, of the connecting wire on the substrate overlaps with a projection of the bonding line on the substrate.

18. The display device of claim 17, wherein the bonding line comprises a first end and a second end respectively connected to two touch metals, the first end of the bonding line is connected to a point between the first end of the connecting wire and the second end of the connecting wire, a point between the first end of the bonding line and the second end of the bonding line is connected to the first end of the connecting wire, and the second end of the bonding line is not connected to the connecting wire.

\* \* \* \* \*